Figure 1:
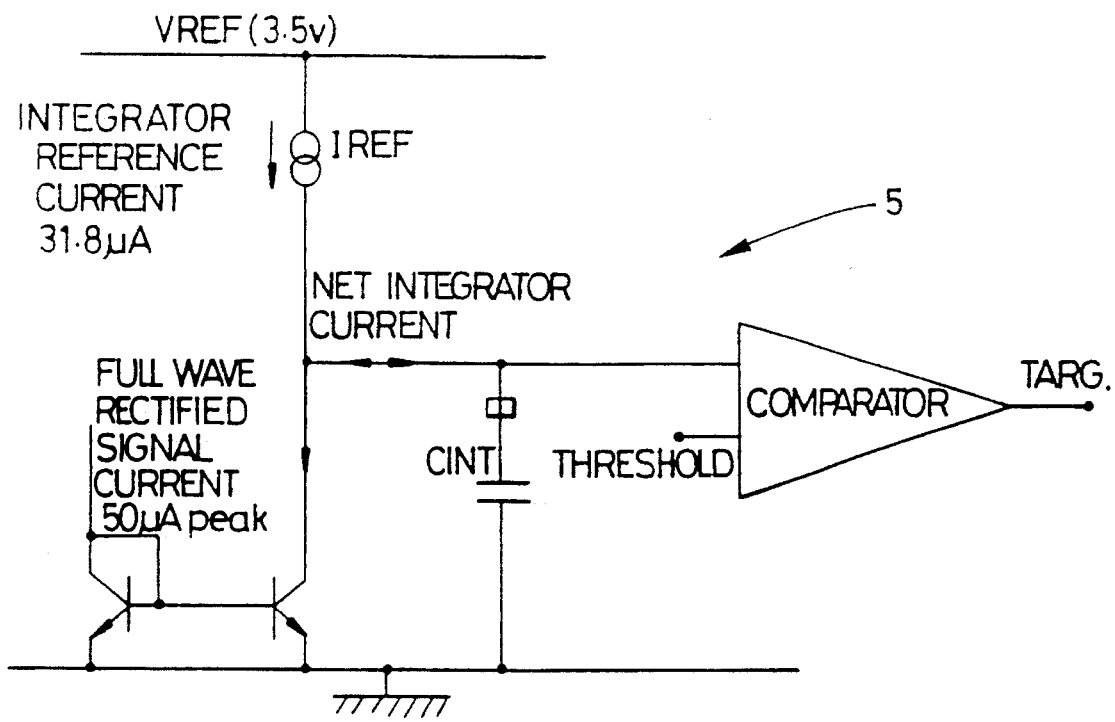

United States Patent

Calder et al.

[11] Patent Number: 5,463,333
[45] Date of Patent: Oct. 31, 1995

[54] PROXIMITY SWITCHES

[75] Inventors: Douglas W. Calder, Berkshire; Arthur J. Bizley, Wiltshire, both of Great Britain

[73] Assignee: Square D Company, Palatine, Ill.

[21] Appl. No.: 244,828

[22] PCT Filed: Dec. 28, 1992

[86] PCT No.: PCT/US92/11231

§ 371 Date: Jun. 15, 1994

§ 102(e) Date: Jun. 15, 1994

[30] Foreign Application Priority Data

Dec. 31, 1991 [GB] United Kingdom .................. 9127572

[51] Int. Cl.$^6$ .................. H03K 3/037; H03K 5/153; G06G 7/64
[52] U.S. Cl. .................. 327/78; 327/205; 327/344; 327/517; 327/89
[58] Field of Search .................. 327/77, 78, 79, 327/87, 89, 68, 74, 205, 336, 341, 343, 344, 345, 365, 142, 198, 58, 59, 62, 91, 93, 96, 95, 517

[56] References Cited

U.S. PATENT DOCUMENTS

| | | | |
|---|---|---|---|
| 3,440,448 | 4/1969 | Dudley | 327/113 |
| 3,889,200 | 6/1975 | Tyau | 327/205 |
| 4,414,512 | 11/1983 | Nelson | 327/93 |
| 4,421,995 | 12/1983 | Gottschalk | 327/74 |
| 4,766,335 | 8/1988 | Shiraishi et al. | 327/198 |
| 5,397,946 | 3/1995 | Truong et al. | 327/74 |

Primary Examiner—Timothy P. Callahan
Assistant Examiner—Toan Tran
Attorney, Agent, or Firm—Michael J. Femal; Larry T. Shrout; Larry I. Golden

[57] ABSTRACT

The present invention provides an integrator 5 with switched hysteresis for inductive proximity switches comprising a reference current source IREF connected between a reference voltage supply rail and a first side of a current mirror, a second side of the current mirror being connected to a proximity switch rectifier, the first side of the current mirror being connected to a capacitor CINT and to one input of a two input comparator, the other input of the comparator being held at a threshold level, wherein a fixed hysteresis current source IHYST is provided in parallel with the current reference source IREF, the fixed hysteresis current source IHYST producing a switchable current which is a fixed proportion of the current of the current reference source IREF, the fixed hysteresis current source IHYST being switched on (off) when a target is detected and off (on) when no target is detected. This invention provides for reduction of effects detrimental to the speed of operation of the switch.

9 Claims, 6 Drawing Sheets

5,463,333

PROXIMITY SWITCHES

This invention relates to a combined integrator and level detector circuit with switched hysteresis and temperature compensation, which is suitable for implementation in an integrated circuit. This configuration is usable in sensors and in particular, inductive proximity switches.

According to one aspect of the invention there is provided a proximity switch including an integrator arranged to provide a supplementary current source which is responsive to an output from a sensing circuit of the proximity switch to provide switched hysteresis.

According to a second aspect of the present invention there is provided an integrator with switched hysteresis for inductive proximity switches comprising a reference current source connected between a reference voltage supply rail and a first side of a current mirror, a second side of the current mirror being connected to a proximity switch rectifier, the first side of the current mirror further being connected with a capacitor and also to one input of a two input comparator, the other input of the comparator being held at a threshold level, wherein a fixed hysteresis current source is provided in parallel with the reference current source, the fixed hysteresis current source producing a switchable current which is a fixed proportion of the current of the reference current source, the fixed hysteresis current source being switched on (off) when a target is detected and off (on) when no target is detected.

The reference current source may be provided by a current mirror comprising two transistors having a predetermined area ratio.

The hysteresis current source may be provided by a second output of the reference current mirror comprising a third transistor having an n:1 area ratio with a first of the two transistors, wherein n is any number.

Emitter resistors may be provided on an input side and/or an output side of the current mirrors, which permits large current ratios to be achieved without the cost of larger transistor area ratios. This also allows the temperature coefficient to be preset in magnitude and direction to offset the intrinsic temperature coefficient of the sensor disclosed in co-pending GB 91 27 570.1.

The comparator may have a first output used to drive an output from the sensor.

The comparator may further have a second output which controls a switch which is used to switch the detection hysteresis current on or off.

The comparator may have a third output which modifies the comparator threshold to improve electrical noise immunity and be less affected by ripple on the signal current.

Preferably, the second and third outputs are connected to first and second saturating transistors.

Preferably, a diode is provided, the cathode of which is connected to the hysteresis current source, and the anode of which is connected to the capacitor.

Preferably, the voltage across the integrating capacitor is limited close to the comparator threshold. This may be done by providing PNP and NPN transistors, their bases being connected to the comparator threshold, while their emitters are connected to the capacitor, their collectors being connected to respective reference supply rails. This increases the operating speed of the proximity switch.

According to another aspect of the present invention there is provided an integrated circuit for use in an integrator as hereinbefore described.

Figure 2:
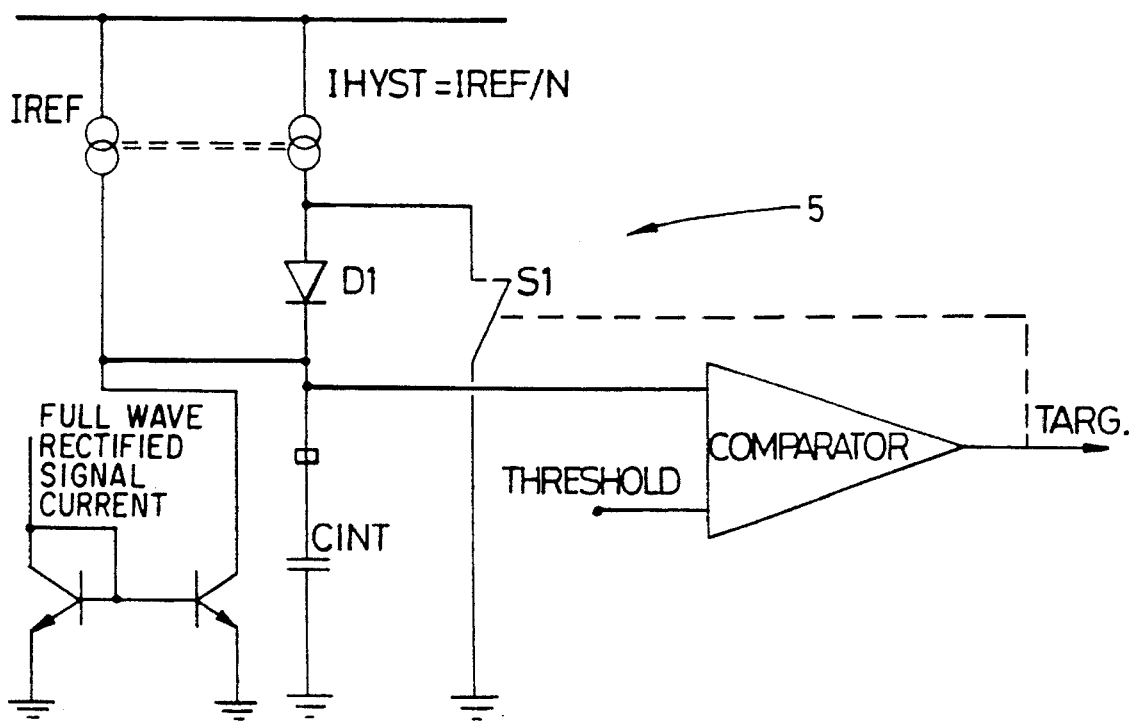
Figure 3:
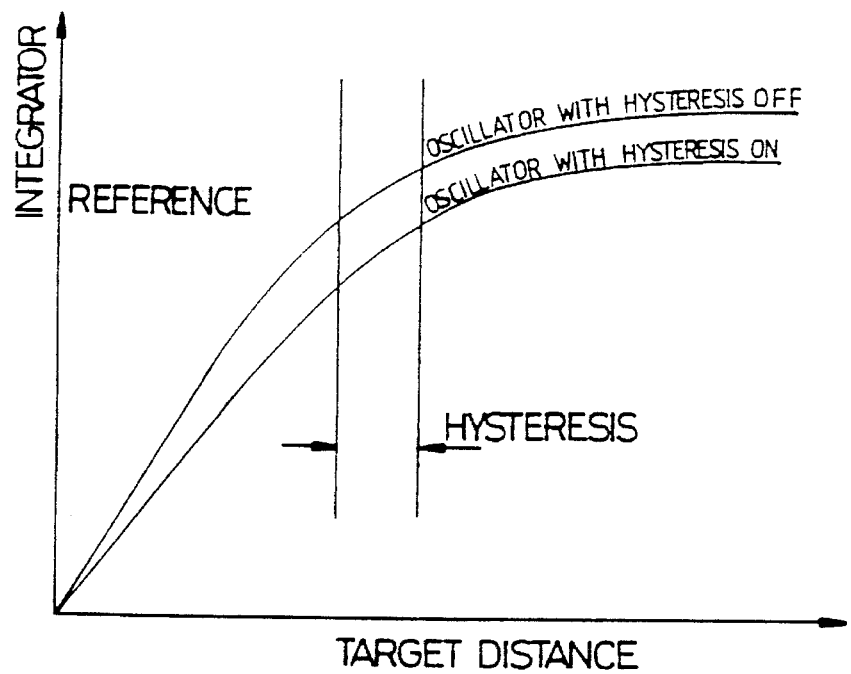
Figure 4:
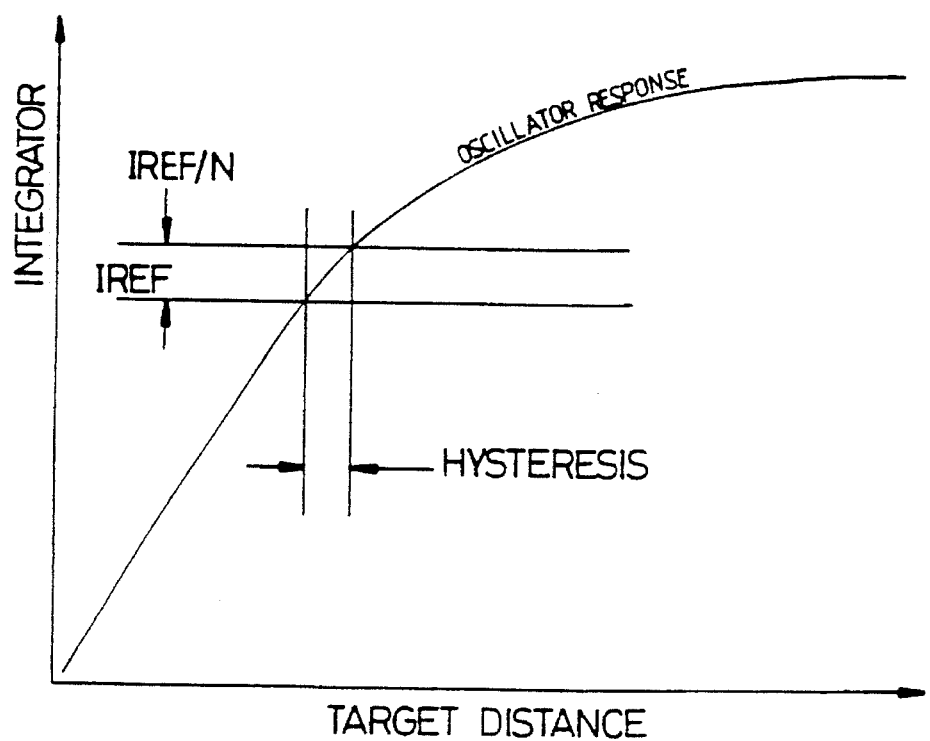
Figure 5:
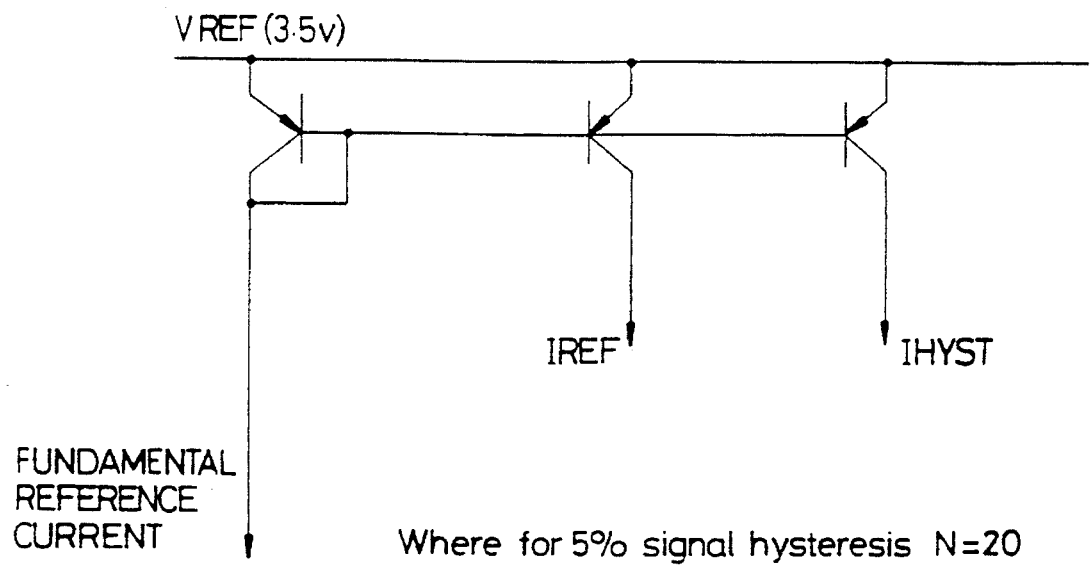
Figure 6:
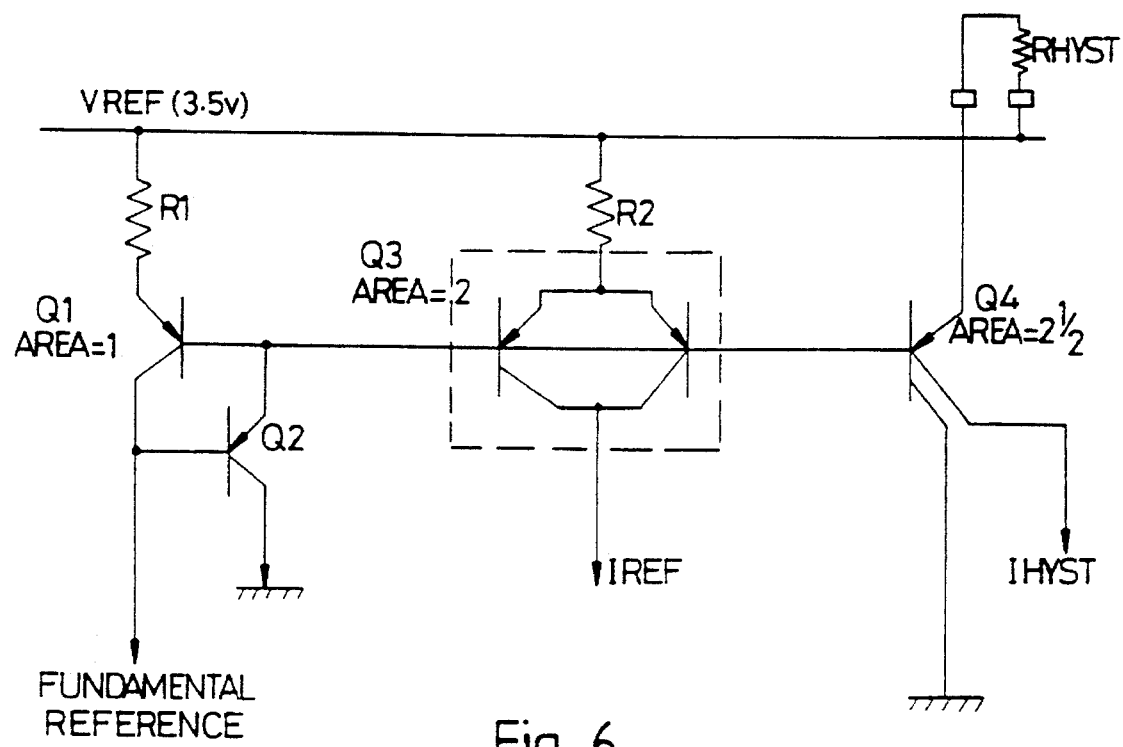
Figure 7:
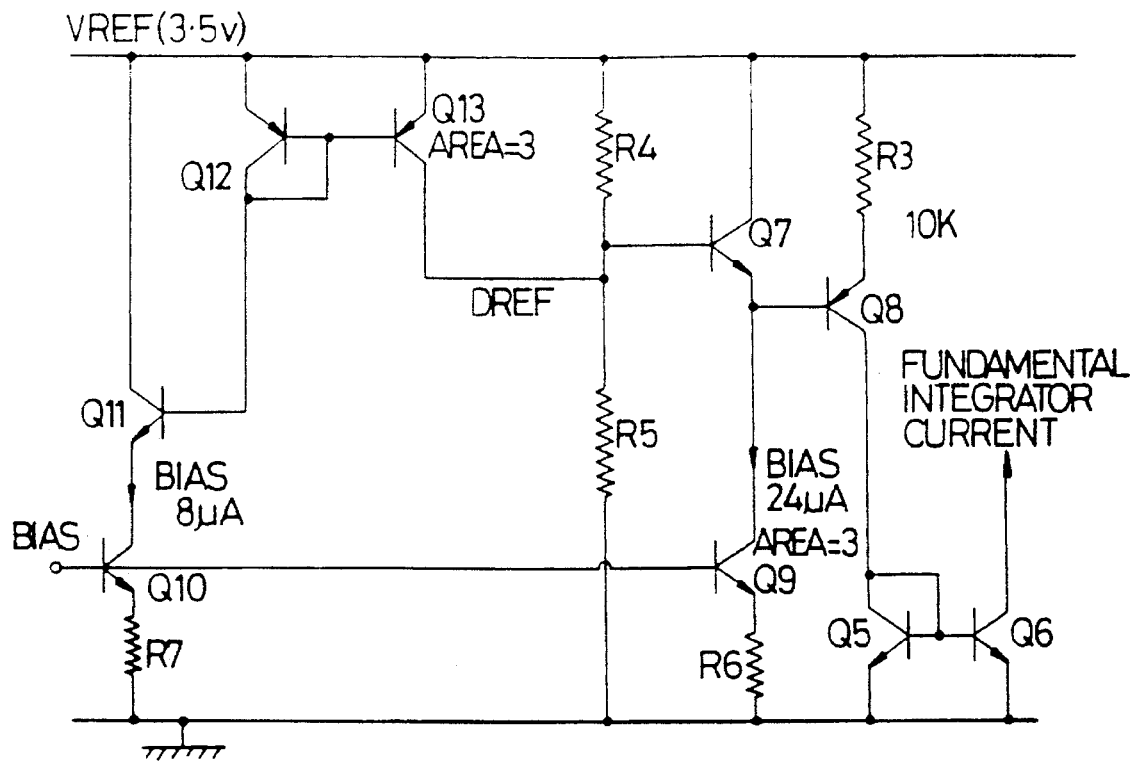
Figure 8:
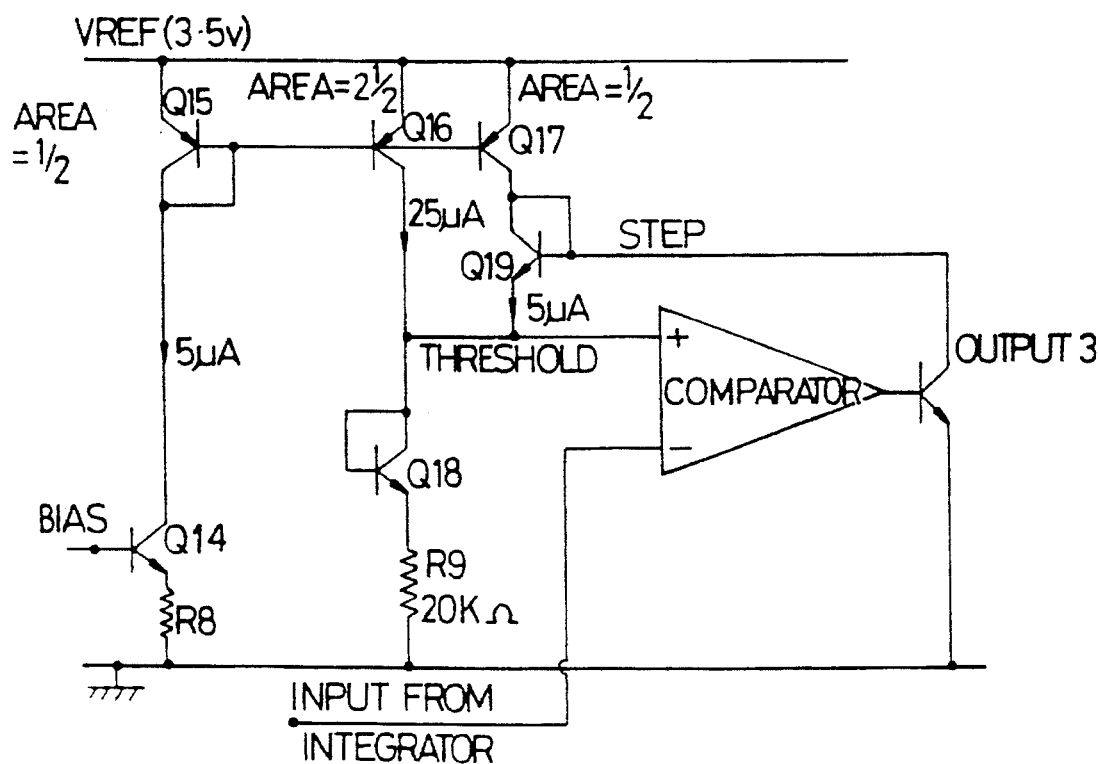
Figure 9:
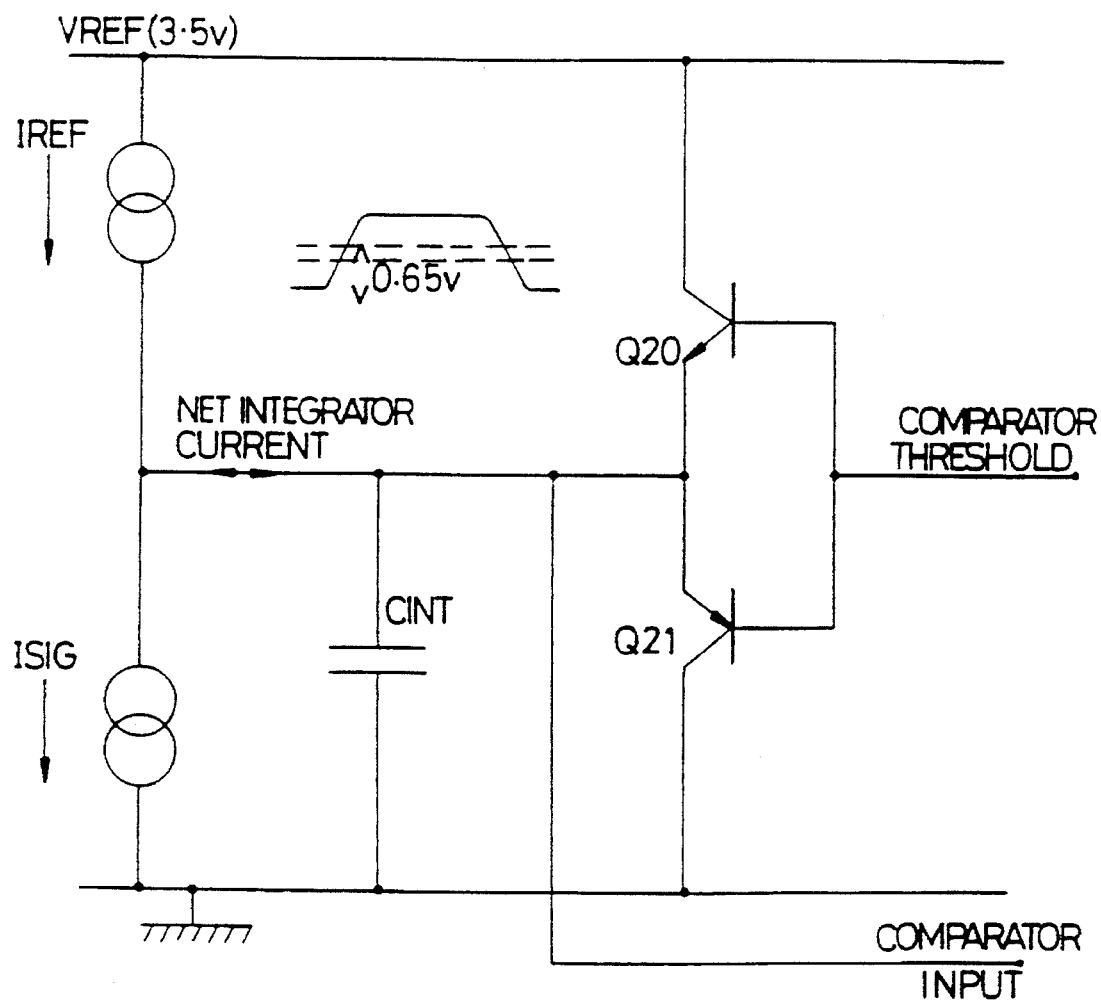

Various embodiments of the invention will now be described by way of example only with reference to the accompanying drawings which are:

FIG. 1. A schematic circuit diagram of a typical basic integrator;

FIG. 2. A schematic circuit diagram of an integrator according to the present invention;

FIG. 3. A curve showing hysteresis achieved by switching the oscillator operating point;

FIG. 4. A curve showing hysteresis as employed in the present invention;

FIG. 5. A first embodiment of reference and hysteresis current sources for use in an integrator according to the present invention;

FIG. 6. A second embodiment of reference and hysteresis current sources for use in an integrator according to the present invention;

FIG. 7. A schematic circuit diagram of a control and source for the integrator reference current;

FIG. 8. A schematic circuit diagram of the circuitry required to set the threshold level of the comparator;

FIG. 9. A schematic circuit diagram of the circuitry necessary to limit the extent of the integrating capacitor voltage; and FIG. 10. A circuit diagram of an actual embodiment (without comparator) of the present invention, which is incorporated on the same integrated circuit as the oscillator/rectifier of co-pending application GB 91 27 570.1.

Basic Integrator

Referring to FIG. 1, there is illustrated an integrator, generally designated 5, comprising a reference current source IREF connected between a reference voltage supply rail VREF and a first side of a current mirror, a second side of the current mirror being connected to a proximity switch rectifier, the first side of the current mirror further being connected with a capacitor CINT and also to one input of a two input comparator, the other input of the comparator being held at a threshold level.

Referring to FIG. 1, the integrator 5 operates by charging (or discharging) the capacitor CINT with the difference between a unidirectional current (the full wave rectified oscillator signal current) and a stable reference current IREF. The capacitor voltage will ramp up (or down) continuously when there is a difference current and remain stable when the mean difference current is zero. The actual capacitor voltage at any specific time is immaterial, target detection will occur when the sense of the ramp is reversed. Thus any reasonable voltage reference point between the integrator supply rails may be used to detect a change in the sense of the ramp. This system is a true integrator.

At target detection Vosc=500 mV peak in a 10 Kohms rectifier resistor, ie 50 µA peak or 31.8 µA mean. Therefore, with IREF=31.8 µA the net integrator current is zero.

Sensor Hysteresis

Referring to FIG. 2 there is provided an integrator, generally designated 5, with switched hysteresis for inductive proximity switches according to the present invention. The integrator 5 comprises a reference current source IREF connected between a reference voltage supply rail VREF and a first side a current mirror, a second side of the current mirror being connected to a proximity switch rectifier, the first side of the current mirror further being connected with a capacitor CINT and also to one input of a two input comparator, the other input of the comparator being held at a threshold level, wherein a fixed hysteresis current source IHYST is provided in parallel with the reference current source IREF, the fixed hysteresis current source IHYST producing a switchable current which is a fixed proportion of the current of the reference current source IREF, the fixed hysteresis current source IHYST being switched on (off) when a target is detected and off (on) when no target is detected.

Detection hysteresis of the detection point is achieved by switching on the (small) additional reference current IHYST=IREF/n when the target is detected. This increases the integrating capacitor voltage ramp rate and requires a larger signal current than detection to reverse the voltage ramp on removal of the target. The additional reference current IHYST is switched off when target removal is detected.

The curve of FIG. 3 shows one method of hysteresis where the reference is fixed and the oscillator response is modified by changing its operating point.

The curve of FIG. 4 shows the methods employed in the present invention.

Integrator Reference and Hysteresis Current Sources

If the reference current and hysteresis current are created in a current mirror network then the ratio between detection and hysteresis will remain sensibly constant. From previous inductive proximity sensor work a nominal target distance hysteresis of 10% of sensing distance requires approximately 5% of signal hysteresis. This is roughly true for most sizes of sensors. In a ratio mirror this will be as shown in FIG. 5.

As can be seen from FIG. 5, the reference current source IREF is provided by a first output of a current mirror comprising first and second transistors having a predetermined area ratio normally 1:1. Further, the hysteresis current source is provided by a second output of the reference current mirror comprising a third transistor having a n:1 area ratio with the first transistor, where n is a whole number.

For 5% signal hysteresis, n=20. This very large area in two transistors is impractical. A modified scheme is to reduce the area ratios (and overall transistor areas) and redress the balance using emitter resistors, as shown in FIG. 6.

In this modified scheme the transistor areas are considerably reduced (and the supply current requirement of the fundamental reference is also reduced).

In FIG. 6, the area ratio of Q3 to ½ Q4 (IREF:IHYST) is 4:1 and the current ratio is further reduced by the ratio of R2 to RHYST. In an integrated circuit embodiment RHYST is made an external resistor which is chosen by the application requirements of the various sensors to set the hysteresis. The values of the fundamental current, and the integrated emitter resistors R1 and R2 are chosen to produce the required IREF of 31.8 µA and to correct for the temperature co-efficient of the ratio and the residual temperature coefficient of the fundamental current versus the oscillator/rectifier temperature coefficient of co-pending application GB 91 27 570.1.

In the embodiment shown in FIG. 6, Q2 is included to reduce base current errors in the mirrors.

In summary, the reference and hysteresis currents IREF, IHYST are created by a current mirror with two outputs. The ratio between these two outputs determines the amount of target hysteresis and is set by the two transistor areas and the values of emitter resistors R1, R2, RHYST used. The emitter resistor RHYST of the hysteresis transistor may be varied to adjust the target hysteresis, and is independent of the oscillator sense distance setting.

The temperature coefficient of the reference current IREF is determined by the values of the emitter resistors of the mirror input and reference output transistors, and by the temperature coefficient of the fundamental input current. During circuit design the circuit can be adjusted to compensate for any intrinsic oscillator temperature coefficient effect.

As can be seen from FIG. 2 the reference current output IREF is connected directly to the integrating capacitor CINT, but the hysteresis current IHYST is connected via a forward biased diode D1. A saturating transistor shown as switch S1, switched off and on at target detection and removal by the comparator, is used to reverse bias the diode D1 and sink the hysteresis current away from the integrating capacitor CINT.

Referring now to FIG. 7 there is shown a practical control and source for the integrator reference current, IREF. As is apparent from FIG. 7 the sense of the fundamental integrator reference has to be reversed in practice. This imposes the use of a simple current mirror to retain the fundamental reference to the correct sense. This is an advantage as any temperature effects in this mirror are cancelled by a similar mirror in the oscillator/rectifier circuit of co-pending application GB 91 27 570.1. Q5 plus Q6 form this sense reversing mirror.

As can be seen from FIG. 7, a reference voltage DREF is created by a potential divider R4, R5 from a local stable supply rail VREF. The voltage DREF appears across R3 via the emitter followers Q7 (NPN) and Q8 (PNP) and creates a current DREF/R3 in the collector of Q8 and thence in the collector of Q6. The value of R3 is chosen to be the same as the rectifier resistors (eg. 10K) in co-pending application GB 91 27 570.1 so that the combination of one NPN Vbe, one PNP Vbe and 10 Kohms resistor gives a temperature co-efficient match of the integrator reference current and the rectifier signal current. The potential divider R4/R5 will be chosen to provide the required integrator reference current IREF.

The bias current for Q7 is derived via Q9, R6 from a common chip bias voltage. Q7 base current errors in the potential divider R4/R5 are compensated by providing Q7 base current from Q13 collector. A dummy emitter follower, Q11, is biased by the collector current of Q10 which sits on the common bias line. The ratio mirror combination of Q10/R7 and Q9/R6 sets up a bias current in the emitter of Q11 equal to ⅓ of the bias current of Q7. The base current for Q11 is supplied by the diode connected input transistor of the current mirror Q12/Q13. Q11 base current is therefore ⅓ of the Q7 base current. The Q12/Q13 mirror is area ratioed 3:1, and so the collector current of Q13 provides exactly the base current required by Q7 and no base currents flow in the potential divider.

Referring again to FIG. 2, the integrator capacitor voltage is applied as the input to a comparator. The comparator consists of two simple long tailed pair amplifiers sharing two inputs and providing three outputs. The second input is set to the switching threshold of the comparator. One of the outputs provides the drive which subsequently operates the output of the sensor. The second output (a saturating transistor) is used to pull down and sink away the detection hysteresis current IHYST. The phase of this output is arranged such that on a positive going transition of the integrator capacitor voltage (target detected) the output transistor is switched off allowing the extra IHYST to flow into the capacitor. The third output is the same as the second but in the opposite phase and is used to reduce the comparator threshold voltage on a positive going transition of the integrator. This creates a snap action hysteresis for the comparator.

Referring to FIG. 8, the nominal threshold voltage of the comparator is set by a constant current flowing through a diode connected NPN transistor Q1 in series with a resistor R9. Threshold hysteresis is implemented by using an output 3 of the comparator to switch an extra current into the resistor R9/diode Q18. This hysteresis provides protection against noise (mainly the integrator ripple from the full wave rectification). A diode and resistor are used to set the threshold so that the temperature co-efficient of the diode roughly offsets the temperature co-efficient of the resistor and to lift the threshold to a usable value.

Q14/R8 are chosen to produce a bias current from the chip common bias line. This current is mirrored in Q15/Q16/Q17 in a ratio of 0.5:2.5:0.5 producing two output currents from Q16 and Q17. The current from Q16 collector flows through the diode connected transistor Q18 and resistor R9 to create the nominal threshold voltage. The current from Q17 collector is routed via the diode connected transistor Q19 to add to the current from Q16 thus increasing the threshold voltage. Diode Q19 is switched on and off by the output 3 of the comparator.

In summary, the comparator threshold hysteresis is achieved in the following way. The basic threshold voltage is set by a constant current source flowing in a resistor R9. A diode Q18 is connected in series with the resistor R9 to limit the value of resistor required and to largely offset the temperature drift of the resistor R9. A small additional current is applied to the resistor R9 and diode Q18 via a second forward biased diode thus increasing the threshold voltage. When the threshold is exceeded by a positive going integrator voltage a saturating transistor, switched on by the comparator output, is used to reverse bias the second diode and sink away the additional current. This reduces the threshold and creates the comparator hysteresis.

Referring to FIG. 9 an NPN Q20 and a PNP transistor Q21 are used to limit the excursion of the integrating capacitor voltage to the comparator threshold ± one Vbe. Without this mechanism, on slow moving or static targets, the integrating capacitor will ramp up or down, unconstrained until either the reference current output or the signal current output becomes saturated. Recovery from the states by a sudden change in the target position will be slow, restricting the speed of operation of the sensor.

In the condition of a target closer than detection, the signal current (see FIG. 9), will be smaller than IREF giving a net charging current for CINT. The voltage on CINT will rise above the comparator threshold causing Q21 base emitter junction to conduct. The CINT voltage will continue to rise until the base emitter current is equal to the net charging current. During this time Q20 will be cut off. Since the CINT voltage would have exceeded the threshold voltage the comparator output would have switched. In the extreme with a very close target the voltage on CINT can only reach Q21 Vbe above threshold. On switching the comparator, CINT voltage is just above threshold and Q21 is barely conducting. However the comparator hysteresis will suddenly reduce the threshold voltage, further turning on Q21 and allowing it to conduct much more of the excess current.

For distant targets (signal current>IREF) the operating mechanism is the same except that Q20 conducts the excess current and Q21 is cut off. The lower limit on the excursion of the voltage on CINT is then the comparator reference voltage minus Q20 Vbe drop. The limited excursion of CINT voltage allows for a much faster recovery from near or far targets thus improving the speed of the integrator system.

In the condition of just on detection where signal current= IREF, there is no excess current to turn on either Q20 or Q21. Both base emitter voltages will be zero and CINT voltage will equal the threshold voltage regardless of the value of the threshold voltage. The mechanism is therefore immune from temperature or voltage drift of the threshold.

Figure 10:
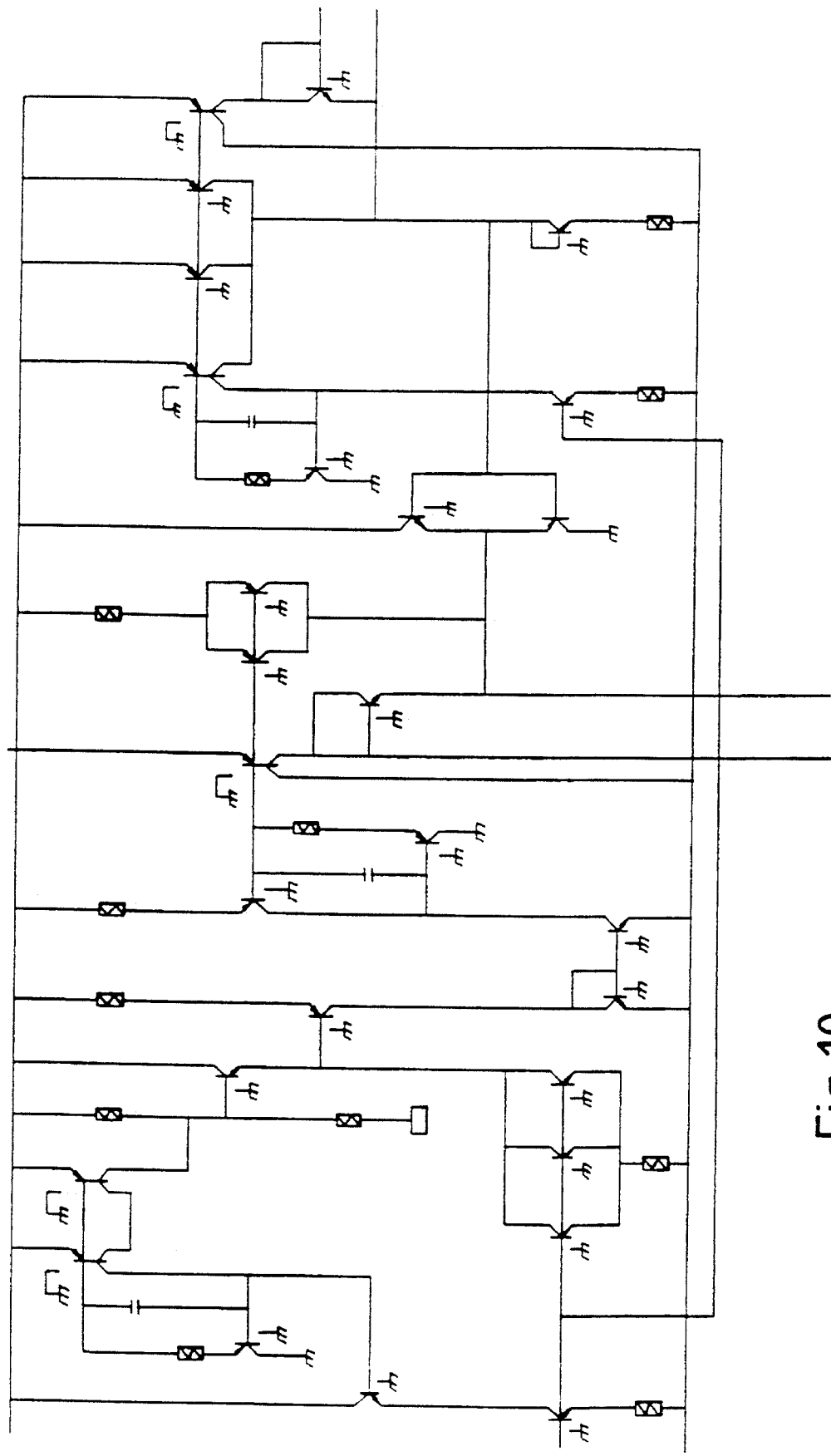

Referring to FIG. 10, there is provided a schematic circuit diagram of an actual embodiment of the present invention, omitting the comparator.

FIG. 10 is self-evident to a skilled person, and is not discussed any further herein.

In normal inductive proximity switch electronics an integrating capacitor is charged (or discharged) by the high signal current when the sensor target is removed but requires a separate discharge (charge) path when the target is closer than detection (no signal current). This has a detrimental effect on the speed of operation of the sensor. The integrator described hereinbefore includes a novel circuit which limits the charging (discharging) voltage excursion of the capacitor thus further improving its speed of operation.

In addition this circuit automatically sets the detection point of the integrator equal to the threshold of a subsequent comparator thus eliminating the errors due to voltage and temperature drift of the comparator threshold.

Further, detection hysteresis is normally provided at the oscillator by connecting or disconnecting additional loss components at the LC network or the distance setting network. This makes it difficult to design and set the sensing distance circuits and to implement temperature compensation of both the sensing distance and hysteresis. The circuit described hereinbefore provides the sensor hysteresis function within the integrator remote from the oscillator allowing independent setting of the detection hysteresis.

Finally, it should be appreciated that the embodiments of the invention hereinbefore described are given by way of example only and are not meant to limit the scope of the invention in any way.

We claim:

1. An integrator with switched hysteresis for inductive proximity switches comprising a reference current source connected between a reference voltage supply rail and one side of a current mirror, the other side of the current mirror being connected to a proximity switch rectifier, the one side of the current mirror further being connected in parallel with a capacitor and also to one input of a two input comparator, the other input to the comparator being held at a threshold level, wherein a fixed hysteresis current source is provided in parallel with the reference current source, the fixed hysteresis current source producing a switchable current which is a fixed proportion of the current of the reference current source, the fixed hysteresis current source being switched on (off) when a target is detected and off (on) when no target is detected.

2. An integrator as claimed in claim 1, wherein the reference current source is provided by a current mirror comprising two transistors having a predetermined area ratio.

3. An integrator as claimed in claim 2, wherein the hysteresis current source is provided by a current mirror comprising two transistors having an n:1 area ratio, wherein n is any whole number other than one.

4. An integrator as claimed in claim 3, wherein emitter resistors are provided on an input side and/or an output side of the current mirrors.

5. An integrator as claimed in any of claims 1 to 4, wherein the comparator has a first output used to drive an output from the sensor.

6. An integrator as claimed in claim 5 wherein the comparator has another output which controls a switch which is used to switch the fixed hysteresis current on or off.

7. An integrator as claimed in claim 6, wherein the other output comprises second and third outputs connected to first and second saturating transistors.

8. An integrator as claimed in claim 7, wherein a diode is provided, the cathode of which is connected to the hysteresis current source, and the anode of which is connected to the capacitor.

9. An integrator as claimed in any of claims 1 to 4, wherein the voltage across the capacitor is limited to the comparator threshold by providing a PNP and an NPN transistor, their bases being connected to the comparator threshold, while their emitters are connected to the capacitor, their collectors being connected to respective reference supply rails.

* * * * *